United States Patent [19]
Hermann et al.

[11] Patent Number: 5,145,834
[45] Date of Patent: Sep. 8, 1992

[54] PROCESSES FOR MAKING TL-CA-BA-CU-O, TL-SR-BA-CU-O AND TL-SR-CU-O SUPERCONDUCTORS BY SOLID STATE SYNTHESIS

[75] Inventors: Allen M. Hermann; Zhengzhi Sheng, both of Fayetteville, Ark.

[73] Assignee: University of Arkansas, Little Rock, Ark.

[21] Appl. No.: 749,712

[22] Filed: Aug. 26, 1991

Related U.S. Application Data

[60] Division of Ser. No. 308,895, Feb. 9, 1989, Pat. No. 5,066,635, which is a continuation-in-part of Ser. No. 155,247, Feb. 12, 1988, Pat. No. 4,962,083.

[51] Int. Cl.$^5$ .................... C01F 11/06; C01G 3/02; C01G 15/00; C04B 35/64
[52] U.S. Cl. .................................. 505/1; 423/604; 423/624; 423/635; 501/123; 505/739; 505/783
[58] Field of Search ............... 505/1, 783, 739; 423/604, 624, 635; 501/123

[56] References Cited

U.S. PATENT DOCUMENTS

| | | | |
|---|---|---|---|
| 5,032,570 | 7/1991 | Ogata | 505/1 |
| 5,093,312 | 3/1992 | Itozaki | 505/1 |

OTHER PUBLICATIONS

Hasegawa, T., High $T_c$ Superconductivity of $(La_{1-x}Sr_x)_2CuO_4$—Effect of Substitution of Foreign Ions for Cu and La on Superconductivity, Japan Journal Applied Physics, vol. 26, No. 4, Apr. 20, 1987, pp. L337–L338.
Kishio, K., Effect of Lanthanide Ion Substitutions for Lanthanum Sites on Superconductivity of $(La_{1-x}Sr_x)_2CuO_{4-\delta}$, Japan Journal of Applied Physics, vol. 26, No. 4, Apr. 20, 1987, L391–L393.
Oshima, S., Superconducting and Structural Properties of the New $Ba_{1-x}Ln_xCuO_{3-y}$ Compound System (Ln=La, Ce, Pr, Nd, Sm, Eu, Gd, Tb, Dy, Ho, Er, and Yb), Japan Journal Applied Physics, vol. 26, No. 5, May 20, 1987, L815–L817.
Tsurumi, S., High Tc Superconductivities of $A_2Ba_4Cu_6O_{14}$, Japan Journal Applied Physics, vol. 26, No. 5, May 20, 1987, L856–L857.
Superconductivity News, vol. 1, No. 2, Aug. 1987, pp. 1, 2, and 6–8.
Yang, K. N., High Temperature Superconductivity in Rare Earth (R)–Barium Copper Oxides $(RBa_2)Cu_3O_{9-\delta}$, Solid State Communications, vol. 63, No. 6, pp. 515–519 (1987).
Tarascon, J. M., Oxygen and Rare-Earth Doping of the 90-K Superconducting Perovskite $YBa_2Cu_3O_{7-x}$, The American Physical Society, vol. 36, No. 1, 1987, 226–234.
Hor, P. H. Superconductivity Above 90 K in the Square-Planar Compound System $ABa_2Cu_3O_{6+x}$ with A=Y, La, Nd, Sm, Eu, Gd, Ho, Er, and Lu, The American Physical Society, vol. 58, No. 18, 1987, 1891–1894.
Khurana, A., Superconductivity Seen Above the Boiling Point of Nitrogen, Physics Today, Apr. 1987, 17–23.
Cava, R. J., Bulk Superconductivity of 91 K in Single-Phase Oxygen-Deficient Perovskite $Ba_2YCu_3O_{9-\delta}$, The American Physical Society, vol. 58, No. 16, 1987, 1676–1679.
Ferreira, J. M., Long-Range Magnetic Ordering in the High -$T_c$ Superconductors $RBa_2Cu_3O_{7-\delta}$ (R=Nd, Sm, Gd, Dy, and Er), The American Physical Society, vol. 37, No. 4, Feb. 1, 1988, 2368–2371.

(List continued on next page.)

*Primary Examiner*—Paul Lieberman
*Assistant Examiner*—John Boyd
*Attorney, Agent, or Firm*—Hermann Ivester

[57] ABSTRACT

A new high temperature superconducting system with transition temperature above 120 K is disclosed. One superconductor in that system in a preferred embodiment comprises TlRBaCuO wherein R is chosen from Group 2A elements excluding Ba. In a preferred embodiment, the superconductor is TlCaBaCuO. In another preferred embodiment, the superconductor comprises TlSrCuO. Processes for making high temperature superconducting system are also disclosed.

18 Claims, 4 Drawing Sheets

OTHER PUBLICATIONS

Kondoh, S. et al., Superconductivity in Tl–Ba–Cu–O System, Solid State Communications, vol. 65, No. 11, 1988, 1329–1331.

Richert, B. et al., Atomic Substitution in $YBa_2Cu_3O_7$; Modification of the Electronic Structure, American Institute of Physics, Conference Proceedings, No. 165 (Thin Film Processing and Characterization of High-Temperature Superconductors), Nov. 6, 1987, 277–283.

Saito, High $T_c$ Superconducting Properties in $(Y_{1-x}Tl_x)Ba_2Cu_3O_{7-y}$, $Y(Ba_{1-x}K_x)_2Cu_3O_{7-x}$ and $YBa_2(Cu_{1-x}Mg_y)_3O_{7-x}$.

Beyers, Crystallography and Microstructure of Tl–Ca–Ba–Cu–O ..., Appl. Phys. Lett. 53(5), Aug. 1, 1989, pp. 432–434.

Todard, Crystal Structure of $Tl_2Ba_2Ca_2Cu_3O_{10}$ at 125 K ..., Science, vol. 240, Apr. 29, 1988, pp. 631–633.

Parkin, $Tl_1Ca_{n-1}Ba_2Cu_nO_{2n+3}$ (n=1, 2, 3): A New Class ..., Phys. Rev. Lett. vol. 61, No. 6, Aug. 8, 1988, pp. 750–753.

Hazen et al., 100-K Superconducting Phases in the Tl–Ca–Ba–Cu–O System, The American Physical Society, vol. 60, No. 16, Apr. 18, 1988, pp. 1657–1660.

Ihara, A New-High-$T_c$ $TlBa_2Ca_3Cu_4O_{11}$ Superconductor With $T_c > 120$ K, Nature, vol. 334, Aug. 11, 1988, pp. 510–511.

Liu et al., Identificiation of Superconducting Phases in a New Structural Series $TlBa_2Ca_{n-1}Cu_nO_{2n+(3-x)}$ by Transmission Electron Microscopy, J. Phys. C: Solid State Phys. 21 (1988) L1039–L1043.

Sulpice et al., Bulk Superconductivity in $Tl_2Ba_2CaCu_2O_8$ and $TlBa_2Ca_2Cu_3O_9$ Phases, Physica C 156 (1988), pp. 243–248.

Shih et al., Multilayer Deposition of Tl–Ba–Ca–Cu–O Films, Appl. Phys. Lett. 53(6), Aug. 8, 1988, pp. 523–525.

Hervieu et al., A New Member of the Thallium Superconductive Series, The "1212" Oxide $TlBa_2CaCu_2O_{8-y}$: Importance of Oxygen Content, Journal of Solid State Chemistry 75, 1988, pp. 212–215.

Sequeira et al., Evidence for K–Substitution in the Tl–Sites of Superconducting $Tl_2CaBa_2Cu_2O_x$: Neutron Diffraction Studies, Physica C 156, (1988), pp. 599–603.

Ginley, Sequential Electron Beam Evaporated Films of $Tl_2CaBa_2Cu_2O_y$ With Zero Resistance at 97 K, Appl. Phys. Lett. 53 (5), Aug. 1, 1988, pp. 406–408.

Politis et al., Superconductivity in Tl–Ca–Ba–Cu–O Compounds, Modern Physics Letters B, vol. 2, No. 6 (1988), pp. 793–798.

Kirschner et al., Preparation Dependent Superconductivity in $TlCaBa_2Cu_3O_{7.5\pm d}$ Above 100 K, Z. Phys.B–Condensed Matter 73 (1988), pp. 293–297.

Liang et al., Structural Characterization of a TlCaBaCu Oxide in $T_c$ Onset = 155 K and $T_c$ zero = 123 K Superconducting Specimens, Appl. Phys. Lett. 53 (15), Oct. 10, 1988, pp. 1434–1436.

Hibble et al., The Relationship Between Chemical Composition and Superconductivity in the Tl–Ba–Ca–Cu–O Superconductors, Physica C 156 (1988), pp. 604–606.

Gopalakrishanan et al., Synthesis and Properties of a 125 K Superconductor in the Tl–Ca–Ba–Cu–O System, Appl. Phys. Lett. 53 (5), Aug. 1, 1988, pp. 414–416.

Sugise et al., Preparation of $Tl_2Ba_2Ca_2Cu_3O_y$ Thick Films from Ba–Ca–Cu–O Films, Japanese Journal Applied Physics, vol. 27, No. 12, 12-88, L2314–2316.

Liang et al., Crystal Structures and Superconductivity of Superconducting Phases in the Tl–Ba–Ca–Cu–O System, Physica C 156 (1988) pp. 616–624.

Ganguli et al., Superconductivity in the Tl–Ca–Ba–Cu–O System: Synthesis Characterization and Mechanism, Modern Physics Letters B, vol. 2, No. 10, (1988), pp. 1169–1176.

Wheatley et al., Interlayer Effects in High-$T_c$ Superconductors, Nature, vol. 333, 12, May 1988, p. 121.

PROCESSES FOR MAKING TL-CA-BA-CU-O, TL-SR-BA-CU-O AND TL-SR-CU-O SUPERCONDUCTORS BY SOLID STATE SYNTHESIS

This is a division of application Ser. No. 308,895, filed Feb. 9, 1989 now U.S. Pat. No. 5,066,635, which is a continuation-in-part of U.S. patent application Ser. No. 155,247, filed on Feb. 12, 1988, now U.S. Pat No. 4,962,083.

BACKGROUND OF THE INVENTION

The present invention relates to high temperature superconductors.

Recently, there has been much work done on the development of high temperature superconductors. Recent developments have indicated that certain combinations of elements are superconducting. However, these compositions typically do not maintain their superconductive attributes at temperatures that exceed approximately 90 K. For example, recently, much work has centered on the use of ternary oxides containing rare earth elements, barium, and copper for superconductivity above the temperature of liquid nitrogen. But, these systems have limited transition temperatures, at or below 93 K, and thus their applications are limited.

U.S. patent application Ser. Nos. 082,222, 089,067, and 144,114, filed on Aug. 6, 1987, Aug. 25, 1987, and Jan. 15, 1988, respectively, in the name of the inventors of the present invention disclose superconductor systems. U.S. patent application Ser. No. 089,067 discloses, in part, a superconductor based on a R-Ba-Cu-O wherein R is chosen from the group of rare earth metals excluding praseodymium, cerium, and terbium. U.S. patent application Ser. No. 082,222 discloses, in part, a superconductor based on a Tb-R-Ba-Cu-O system wherein R is chosen from the group of rare earth metals excluding praseodymium, cerium, and terbium. U.S. patent application Ser. No. 144,114 discloses, in part, a superconductor based on a TlBaCuO system.

Although superconductors prepared pursuant to the systems disclosed in the above-identified patent applications have produced "high temperature" superconductors and yielded optimistic test results, superconductors prepared pursuant to the present invention have yielded higher transition temperatures. Indeed, based on the knowledge of the inventors, superconductors produced pursuant to the present invention have yielded the highest transition temperatures to date for any superconductor.

A superconductor with a higher transition temperature would be desirable for many reasons. Such a superconductor would: (1) facilitate the discovery of the correct theory on oxide superconductivity; (2) provide a framework for the search of higher temperature, even room temperature superconductors; (3) allow superconducting components to operate at higher temperatures with lower cost; and (4) provide low cost processing and manufacturability.

Furthermore, many of the superconductor compositions that have been proposed to date are based on rare earth metals. Due to the short supply and cost of these rare earth metals, the compositions constructed therefrom can be quite expensive.

Accordingly, there is a need for improved superconductors with higher transition temperatures.

SUMMARY OF THE INVENTION

The present invention provides improved superconductors with transition temperatures above 120 K. Furthermore, the present invention provides superconductors that contain no rare earth elements.

In an embodiment, the present invention preferably comprises a system comprising:

Tl-R-Ba-Cu-O wherein: R is a Group 2A element, excluding barium. As used herein, Group 2A refers to the following elements: Be; Ba; Mg; Ca; Sr; and Ra. Preferably, R is chosen from the group of elements consisting of strontium (Sr) and calcium (Ca).

In another embodiment, the system of the present invention comprises:

Tl-Sr-Cu-O

In a preferred embodiment, the superconductive system of the present invention has the following approximate stoichiometry:

$TlCa_yBa_zCu_uO_v$ wherein:

y is greater than or equal to 0 and less than or equal to 5;

z is greater than or equal to 0 and less than or equal to 5;

y+z is greater than or equal to 0.2 and less than or equal to 5;

u is greater than or equal to 0.5 and less than or equal to 15; and v is greater than or equal to z+y+u and less than or equal to 2+z+y+u.

In another preferred embodiment, the superconductive system of the present invention has the following approximate stoichiometry:

$TlSr_yBa_zCu_uO_v$ wherein:

y is greater than or equal to 0 and less than or equal to 5;

z is greater than or equal to 0 and less than or equal to 5;

y+z is greater than or equal to 0.2 and less than or equal to 5;

u is greater than or equal to 0.5 and less than or equal to 15; and v is greater than or equal to z+y+u and less than or equal to 2+z+y+u.

In another preferred embodiment, the superconductive system of the present invention has the following approximate stoichiometry:

$TlSr_yCu_uO_v$ wherein:

y is greater than or equal to 0.2 and less than or equal to 5;

u is greater than or equal to 0.5 and less than or equal to 15; and v is greater than or equal to y+u and less than or equal to 2+y+u A method of producing the high temperature superconductor system of the present invention is also provided. In an embodiment, the method allows the superconductor to be prepared at temperatures of between approximately 850° to about 950° C. in flowing oxygen. The method further allows the superconductor to be produced rapidly in about 30 minutes.

Accordingly, an advantage of the present invention is to provide a new superconductor with high transition temperatures.

A further advantage of the present invention is to provide a material system that may produce higher temperature superconductors, possibly even room temperature superconductors.

A still further advantage of the present invention is that it provides a new high temperature superconductor that is formed at a relatively low temperature, and allows for rapid production.

Furthermore, an advantage of the present invention is that it provides a method for making a new high temperature superconductor.

Still another advantage of the present invention is that it provides a method for rapidly making a high temperature superconductor.

Yet another advantage of the present invention is that it provides a method for making a superconductor having a transition temperature above 120 K.

Moreover, another advantage of the present invention is that it provides a superconductor system that does not include rare earth metals.

Another advantage of the present invention is that the high temperature superconductor can be used at temperatures near the boiling point of liquid nitrogen where higher critical currents are to be expected.

Additional advantages and features of the present invention are described in, and will be apparent from, the detailed description of the presently preferred embodiments and the drawings.

DETAILED DESCRIPTION OF THE PRESENTLY PREFERRED EMBODIMENTS

The present invention provides a new superconductor with transition temperature above 120 K. The present invention also provides a superconductor system that may produce higher temperature superconductors, even room temperature superconductors by further elemental substitution and variation of preparation procedures. In addition, the present invention provides a method for making these new high temperature superconductors.

To date, the inventors of the present invention are not aware of any superconductors that have transition temperatures above 100 K. Of course, low transition temperatures limit the applications of the superconductors. The inventors of the present invention have discovered a superconductor system that has a transition temperature above 120 K; which is at least 20 K higher than that of any known high temperature superconductor. Because of its higher transition temperature, the present invention provides a superconductor that can be operated at higher temperatures with lower cost. Furthermore, the inventors of the present invention have found that the high temperature superconductor system of the present invention can be rapidly produced at relatively low temperatures.

In an embodiment of the present invention, the system comprises:

TlRBaCuO wherein:

R is an element chosen from Group 2A elements excluding barium.

Preferably, R is chosen from the group of elements consisting of calcium (Ca) and strontium (Sr).

In another embodiment of the present invention, the system comprises:

TlSrCuO

In an embodiment, a superconductor based on the new superconductor system of the present invention has the following approximate stoichiometry:

$TlCa_yBa_zCu_uO_v$ wherein:

Y is greater than or equal to 0 and less than or equal to 100;

z is greater than or equal to 0 and less than or equal to 100;

u is greater than or equal to 0 and less than or equal to 100; and v is greater than or equal to z+y+u and less than or equal to 2+y+z+u. It should be noted that all stoichiometries set forth herein are nominal (or starting) compositions.

In a preferred embodiment, a superconductor based on the new superconductive system of the present invention has the following approximate stoichiometry:

$TlCa_yBa_zCu_uO_v$ wherein:

y is greater than or equal to 0 and less than or equal to 5;

z is greater than or equal to 0 and less than or equal to 5;

Y+z is greater than or equal to 0.2 and less than or equal to 5;

u is greater than or equal to 0.5 and less than or equal to 15; and v is greater than or equal to z+y+u and less than or equal to 2+z+y+u.

In another preferred embodiment, a superconductor based on the new superconductive system of the present invention has the following approximate stoichiometry:

$TlSr_yBa_zCu_uO_v$ wherein:

y is greater than or equal to 0 and less than or equal to 5;

z is greater than or equal to 0 and less than or equal to 5;

y+z is greater than or equal to 0.2 and less than or equal to 5;

u is greater than or equal to 0.5 and less than or equal to 15; and v is greater than or equal to z+y+u and less than or equal to 2+z+y+u.

In an embodiment, the superconductor of the present invention has the following approximate stoichiometry:

$TlSr_yCu_uO_v$ wherein:

y is greater than or equal to 0.2 and less than or equal to 5;

u is greater than or equal to 0.5 and less than or equal to 15; and v is greater than or equal to y+u and less than or equal to 2+y+u.

By way of example, and not limitation, examples of the new high temperature superconductors of the present invention will now be given.

EXAMPLE 1

A. To create the superconductor of Example 1, the following reagents were utilized:
1. $Tl_2O_3$
2. CaO
3. $BaCO_3$
4. CuO B. The following procedure was followed using the above reagents to create a superconductor:

1. A mixture of a one molar portion of $BaCO_3$ and a three molar portion of CuO was ground with an agate mortar and pestle. The ground mixture was heated in air at approximately 925° C. for more than 24 hours (with several intermediate grindings) to obtain a uniform black $BaCu_3O_4$ powder.

2. The resultant $BaCu_3O_4$ powder was mixed with appropriate amounts of $Tl_2O_3$ and CaO to obtain a mixture with a nominal composition of $Tl_{1.86}CaBaCu_3O_{7.8+x}$, which was completely ground, and pressed into a pellet.

3. A tube furnace was heated to a temperature of between approximately 850 to about 950° C. with oxygen flowing therein.

4. The pellet was placed in the tube furnace maintaining the temperature and oxygen flow for approximately 2 to about 5 minutes.

5. The pellet was then taken out of the furnace and quenched in air to room temperature.

The samples prepared by this procedure had an onset temperature of above 120 K, a midpoint of about 110 K, and a zero resistance temperature of about 100- K. Qualitative magnetic examinations of the superconductor of this example demonstrate a strong Meissner effect, indicating a large volume fraction of superconducting phase.

EXAMPLE 2

A. In this example, the following reagents were utilized:
1. $Tl_2O_3$
2. CaO
3. $BaCO_3$
4. CuO B. To produce a superconductor with these reagents, the following procedure was followed:

1. A mixture of a one molar portion of $BaCO_3$ and a three molar portion of CuO was ground with an agate mortar and pestle, heated in air at approximately 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and CaO to obtain a mixture with a nominal composition of $Tl_{1.86}CaBaCu_3O_{7.8+x}$, which was completely ground, and pressed into a pellet.

3. A tube furnace was heated to a temperature of approximately 850 to about 950° C. with oxygen flowing therein.

4. The pellet was placed in the tube furnace maintaining the temperature and oxygen flow for approximately 2 to about 5 minutes.

5. The pellet was taken out of the furnace and quenched in air to room temperature.

6. The pellet was then annealed at approximately 450° C. in flowing oxygen for 6 hours.

Figure 1:
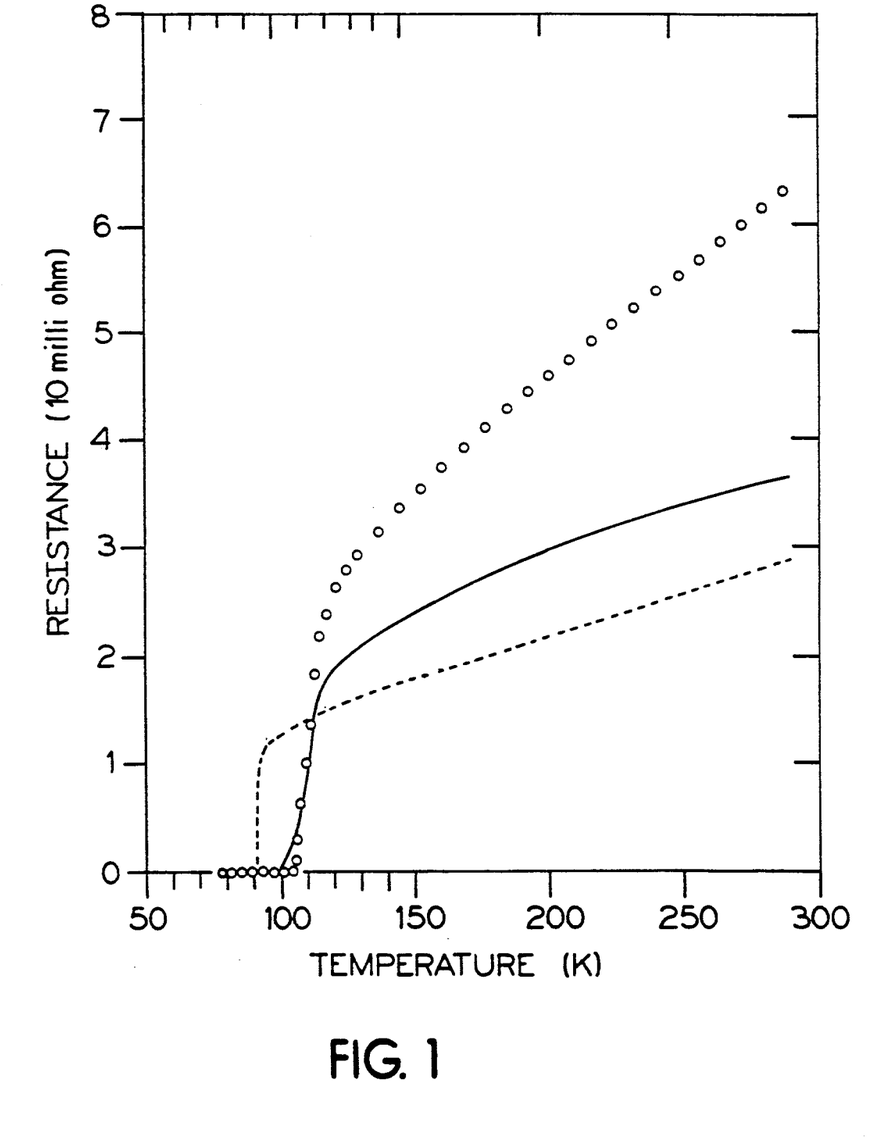
FIG. 1 illustrates a graph of electrical resistance versus temperature for three superconductor samples, the dashed line represents a Eu-Ba-Cu-O superconductor and the solid line and line represented by "0" depict samples based on a Tl-Ca-Ba-Cu-O superconductor system.

The samples prepared by this procedure had an onset temperature of above 120K, a midpoint of about 110K, and a zero resistance temperature of about 100K. FIG. 1 illustrates the resistance-temperature dependence for a superconductor sample prepared pursuant to this example. The sample is indicated by a solid line. By way of comparison, a superconductor based on Eu-Ba-Cu-O system is illustrated by dashed lines. Qualitative magnetic examinations of the samples demonstrated a strong Meissner effect, indicating a large volume fraction of superconducting phase.

EXAMPLE 3

A. The following reagents were utilized in this example:
1. $Tl_2O_3$
2. CaO
3. $BaCO_3$
4. CuO B. The following procedure was followed:

1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and CaO to obtain a mixture with a nominal composition of $Tl_2Ca_2$-

$_5BaCu_3O_{8.5+x}$, which was completely ground, and pressed into a pellet.

3. A tube furnace was heated to a temperature of approximately 850° to about 950° C. with oxygen flowing therein.

4. The pellet was placed in the tube furnace maintaining the temperature and oxygen flow for approximately 2 to about 5 minutes.

5. The pellet was then taken out of the furnace and quenched in air to room temperature.

The samples prepared by this procedure had an onset temperature of above 123K, a midpoint of about 112K, and a zero resistance temperature of about 103K. Qualitative magnetic examinations of the samples showed a strong Meissner effect, indicating a large volume fraction of superconducting phase.

EXAMPLE 4

A. The following reagents were utilized in this example:
1. $Tl_2O_3$
2. CaO
3. $BaCO_3$
4. CuO B. The following procedure was followed in this example:

1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and CaO to obtain a mixture with a nominal composition of $Tl_2Ca_{1.5}BaCu_3O_{8.5+x}$, which was completely ground, and pressed into a pellet.

3. A tube furnace was heated to a temperature of between approximately 850° to about 950° C. with oxygen flowing therein.

4. The pellet was placed in the tube furnace maintaining the temperature and oxygen flow for approximately 2 to about 5 minutes.

5. The pellet was then furnace-cooled to room temperature.

The samples prepared by this procedure had an onset temperature of above 123K, a midpoint of about 112K, and a zero resistance temperature of about 103K. FIG. 1 illustrates the resistance-temperature dependence for a superconductor sample prepared pursuant to this example. The sample is indicated by the line defined by "O" in the figure. Qualitative magnetic examinations of these samples demonstrated a strong Meissner effect, indicating a large volume fraction of superconducting phase.

EXAMPLE 5

A. In this example, the following reagents were utilized:
1. $Tl_2O_3$
2. CaO
3. $BaCO_3$
4. CuO B. In this example, the following procedure was followed:

1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and CaO to obtain a mixture with a nominal composition of $Tl_{1.5}Ca_{0.5}BaCu_3O_{6.8+x}$, which was completely ground, and pressed into a pellet.

3. A tube furnace was heated to a temperature of approximately 850° to about 950° C. with oxygen flowing therein.

4. The pellet was placed in the tube furnace maintaining the temperature and oxygen flow for approximately 2 to about 5 minutes.

5. The pellet was then taken out of the furnace and quenched in air to room temperature.

The samples prepared by this procedure had an onset temperature of about 120K, a midpoint of about 110K, and a zero resistance temperature of above liquid nitrogen temperature.

EXAMPLE 6

A. The following reagents were utilized in this example:
1. $Tl_2O_3$
2. $SrCO_3$
3. CuO B. The following procedure was followed in this example:

1. A mixture of a 0.45 molar portion of $SrCO_3$ and a three molar portion of CuO was ground with an agate mortar and pestle, heated in air at 925° C. for more than 24 hours (with several intermediate grindings) to obtain a uniform black $Sr_{0.45}Cu_3O_{3.5}$ powder.

2. The resulting $Sr_{0.45}Cu_3O_{3.5}$ powder was mixed with appropriate amount of $Tl_2O_3$ to obtain a mixture with a nominal composition of $Tl_2Sr_{0.45}Cu_3O_{6.5+x}$, which was completely ground, and pressed into a pellet.

3. A tube furnace was heated to a temperature of between approximately 1000° to about 1050° C. with oxygen flowing therein.

4. The pellet was placed in the tube furnace maintaining the temperature and oxygen flow for approximately 2 to about 5 minutes.

5. The pellet was then taken out of the furnace and quenched in air to room temperature.

Figure 2:
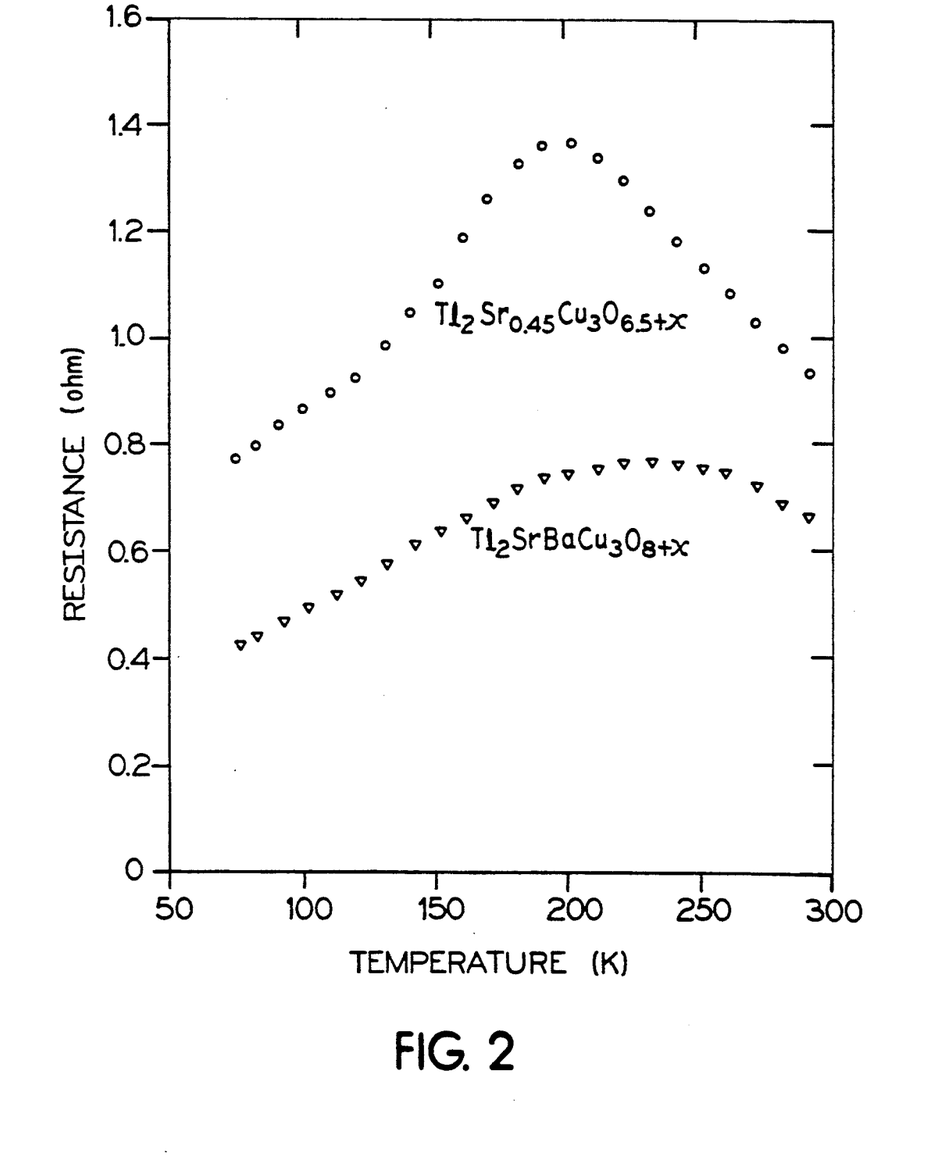
FIG. 2 illustrates a graph of electrical resistance versus temperature for two superconductor samples.  represents a superconductor based on TlSrCuO, while  represents a superconductor based on TlSrBaCuO.

Resistance-temperature dependence for a sample prepared pursuant to this example is illustrated in FIG. 2 as represented by the "●" line. Although resistance did not reach zero above liquid temperature, it may reach zero at lower temperatures. In particular, a decrease in the resistance at about 200K may originate from the onset of a high temperature superconducting phase of the sample.

EXAMPLE 7

A. In this example, the following reagents were utilized:
1. $Tl_2O_3$
2. $SrCO_3$
3. $BaCO_3$
4. CuO B. In this example, the following procedure was followed 1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and $SrCO_3$ to obtain a mixture with a nominal composition of $Tl_2SrBaCu_3O_{8+x}$, which was completely ground and pressed into a pellet.

3. A tube furnace was heated to a temperature of between approximately 900° to about 950° C. with oxygen flowing therein.

4. The pellet was placed in the tube furnace maintaining the temperature and oxygen flow for approximately 2 to about 5 minutes.

5. The pellet was then taken out of the furnace and quenched in air to room temperature.

Resistance-temperature dependence for the sample prepared pursuant to this example is illustrated in FIG. 2 as the "▼" line. Although the resistance did not reach zero above Liquid nitrogen temperature, it may reach zero at lower temperatures. In particular, a decrease in resistance at about 250K may originate from onset of a high temperature superconducting phase of the sample.

EXAMPLE 8

A. The following reagents were utilized:
1. $Tl_2O_3$,
2. CaO
3. $BaCO_3$,
4. CuO.

B. The following procedure was followed:
1. A mixture of a one molar portion of $BaCO_3$ and a three molar portion of CuO was ground with an agate mortar and pestle, heated in air at approximately 925° C. for more than 24 hours (with several intermediate grindings) to obtain a uniform black $BaCu_3O_4$ powder.

2. The resulting $BaCu_3O_4$ powder was mixed with appropriate amounts of $Tl_2O_3$ and CaO to obtain mixtures with nominal compositions of $Tl_2Ca_yBaCu_3O_{7+y+x}$ with y=1,1.5,2,3, and 4.

3. The mixtures were completely ground, and pressed into pellets.

4. A tube furnace was heated to approximately 850° to about 950° C. in flowing oxygen.

5. The pellets were placed in the tube furnace maintaining the temperature and oxygen flow for approximately 2 to about 5 minutes.

6. The pellets were then furnace-cooled to room temperature.

Figure 3:
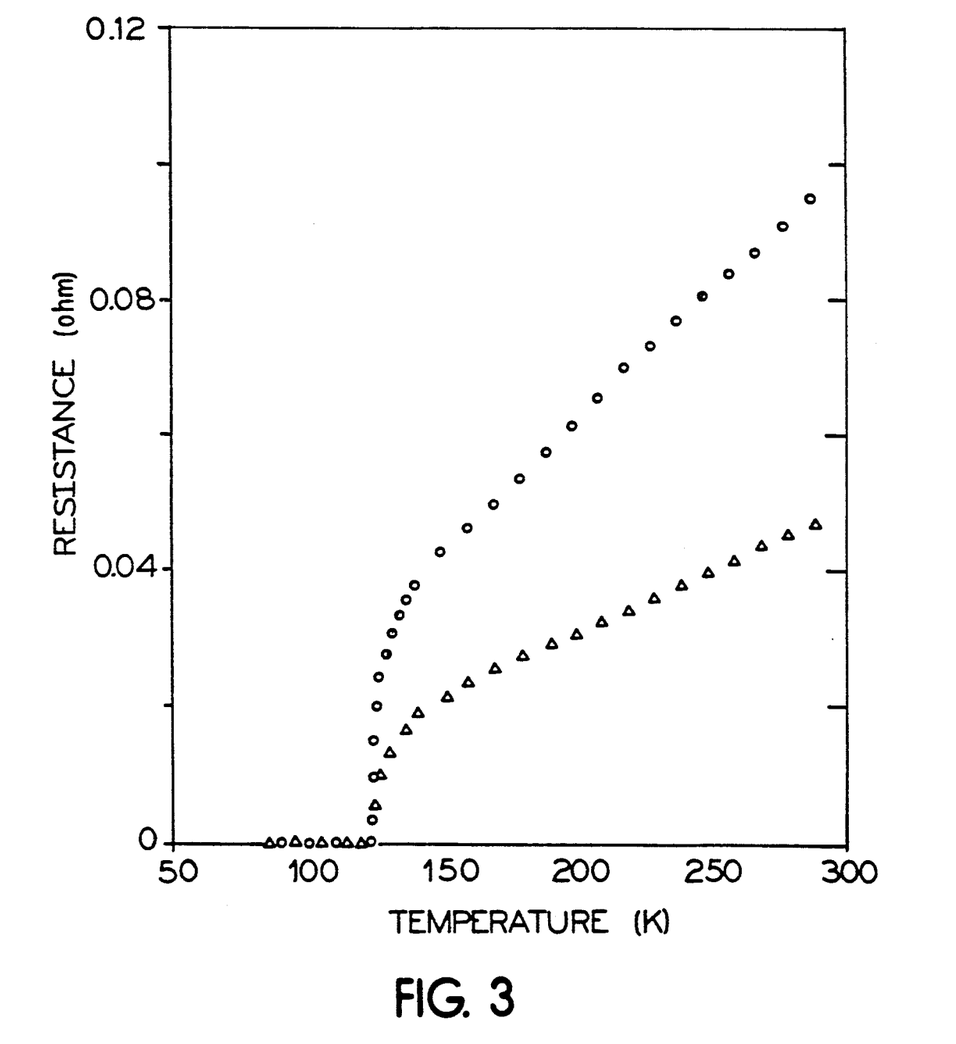
FIG. 3 illustrates a graph of electrical resistance versus temperature for two superconductor samples made pursuant to the present invention. Triangles represent sample $Tl_2Ca_2BaCu_3O_{9+x}$, and circles represent sample $Tl_2Ca_4BaCu_3O_{11+x}$. All compositions quoted are nominal (starting).
Figure 4A:
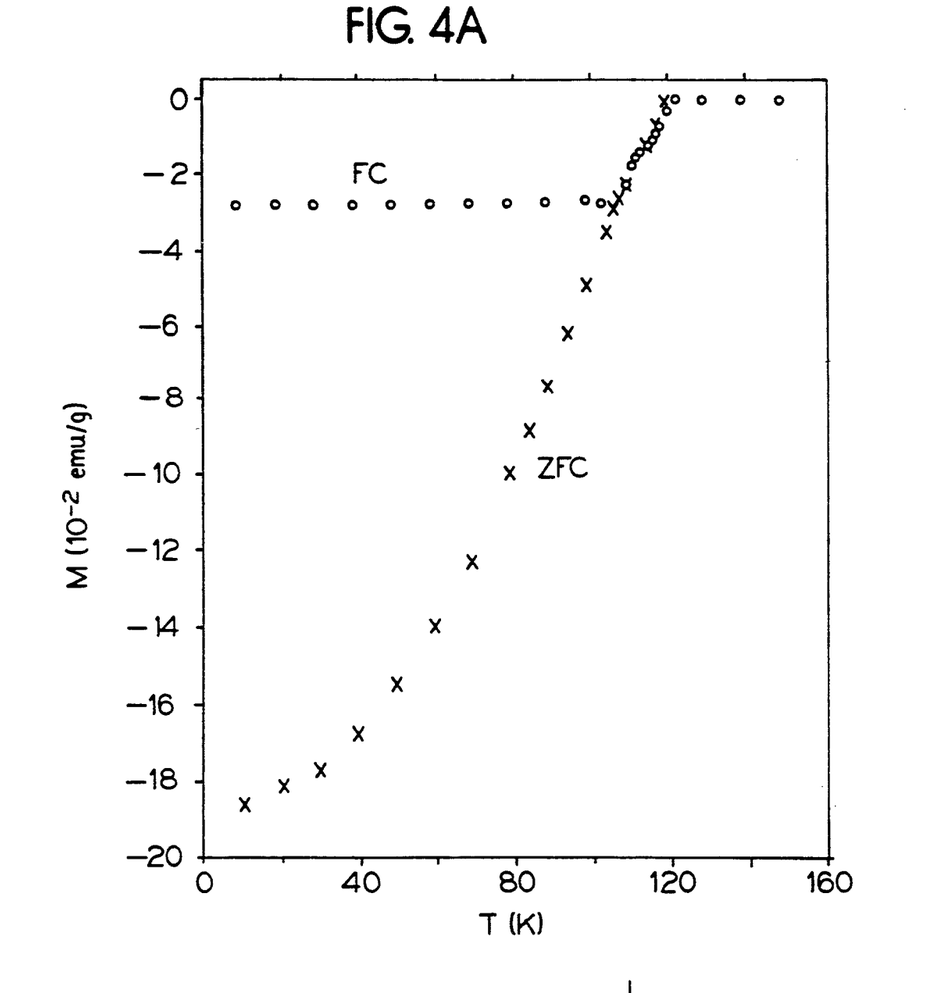
FIG. 4A illustrates field-cooled (FC) and zero field-cooled (ZFC) magnetization as a function of temperature for a dc field of 1mT for a sample of $Tl_2Ca_4BaCu_3O_{11+}$ . The two data traces in the inset (FIG. 4B) illustrate the sharp onset of superconductivity observed by a microwave technique. Sample A is $Tl_2Ca_4BaCU_3O_{11+x}$ with onset temperature 118.3 K, and for comparison, data for a sample of $EuBa_2Cu_3O_{7-z}$ (Sample B) with onset temperature of 94.4 K is plotted.
Figure 4B:
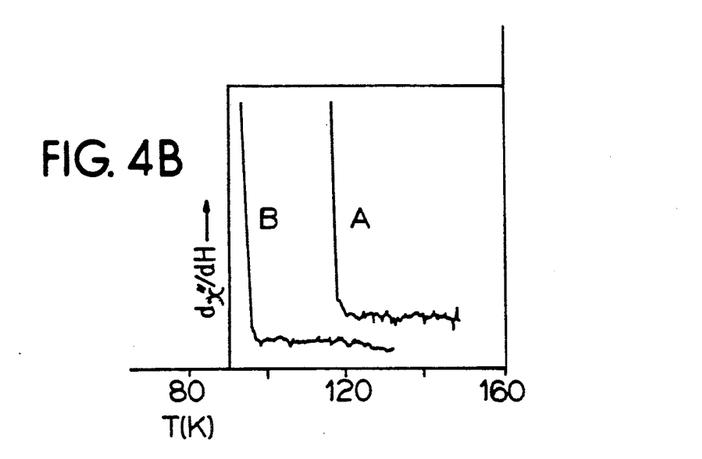

The samples prepared by this procedure had transition temperatures above 120K. FIG. 3 illustrates resistance-temperature dependences for samples with nominal compositions of $Tl_2Ca_2BaCu_3O_{9+x}$ and $Tl_2Ca_4BaCu_3O_{11+x}$. resistance at 121K. FIG. 4 illustrates dc magnetization, field cooled and zero field cooled, as a function of temperature for a $Tl_2Ca_4BaCu_3O_{11+x}$. Onset temperature of diamagnetism for this sample is above 120K. In the inset of FIG. 4, the microwave data for this sample is set forth, comparing that of a $EuBa_2Cu_3O_{7-x}$, indicating that the onset temperature of the $Tl_2Ca_4BaCu_3O_{11+x}$ is 23.9K higher than that of the $EuBa_2Cu_3O_{7-x}$.

EXAMPLE 9

A. The following reagents were utilized:
1. $Tl_2O_3$,
2. $CaCO_3$,
3. $BaCO_3$,
4. CuO.

B. The following procedure was followed:
1 A mixture of $CaCO_3$, $BaCO_3$, and CuO with a molar ratio of 2:2:3 was ground with an agate mortar and pestle, heated in air at approximately 925° C. for more than 24 hours (with several intermediate grindings) to obtain a uniform black $Ca_2Ba_2Cu_3O_7$ powder.

2. The resulting $Ca_2Ba_2Cu_3O_7$ powder was mixed with appropriate amounts of $Tl_2O_3$ to obtain a mixture with a nominal composition of $Tl_2Ca_2Ba_2Cu_3O_{10}$.

3. The mixture was completely ground, and pressed into a pellet.

4. A tube furnace wa heated to approximately 850° to about 950° C. in flowing oxygen.

5. The pellet was placed in the tube furnace maintaining the temperature and oxygen flow for approximately 2 to about 5 minutes.

6. The pellet was then furnace-cooled to room temperature.

The samples prepared by this procedure had transition temperatures above 120K.

EXAMPLE 10

A. The following reagents were utilized:
1. $Tl_2O_3$,
2. $CaCO_3$,
3. $BaCO_3$,
4. CuO.

B. The following procedure was followed:
1. A mixture of $CaCO_3$, $BaCO_3$, and CuO with a molar ratio of 3:1:3 was ground with an agate mortar and pestle, heated in air at approximately 925° C. for more than 24 hours (with several intermediate grindings) to obtain a uniform black $Ca_3BaCu_3O_7$ powder.

2. The resulting $Ca_3BaCu_3O_7$ powder was mixed with appropriate amounts of $Tl_2O_3$ to obtain a mixture with a nominal composition of $Tl_2Ca_3BaCu_3O_{10}$.

3. The mixture was completely ground, and pressed into a pellet.

4. A tube furnace was heated to approximately 850° to about 950° C. in flowing oxygen.

5. The pellet was placed in the tube furnace maintaining the temperature and oxygen flow for approximately 2 to about 5 minutes.

6. The pellet was then furnace-cooled to room temperature.

The samples prepared by this procedure had transition temperatures above 120K.

EXAMPLE 11

In this example, two high temperature superconducting phases were isolated and identified from the Tl-Ca-Ba-Cu-O system of the present invention.

The compositions and crystal structures of at least two high temperature superconducting phases in the Tl-Ca-Ba-Cu-O superconducting system of the present invention were determined. To this end, superconducting Tl-Ca-Ba-Cu-O samples, designated TCBCO-1, TCBCO-2, and TCBCO-3 were studied. The initial Tl:Ca:Ba:Cu metal ratios for these samples were 2:2:1:3, 2:3:1:3, and 2:2:2:3, respectively.

The Tl-Ca-Ba-Cu-O samples were prepared pursuant to the method of the present invention. In this regard, appropriate amounts of $Tl_2O_3$, CaO, and $BaCu_3O_4$ (or $Ba_2Cu_3O_5$) were completely mixed, ground, and pressed into a pellet. A quartz boat containing the pellet was then put into a tube furnace, which had been preheated to approximately 880° to about 910° C. The sample was heated for approximately 3 to about 5 min.

in flowing oxygen and furnace cooled to room temperature in approximately 1 to about 1.5 hours.

The resultant Tl-Ca-Ba-Cu-O samples displayed superconducting transition temperatures above 120K.

To determine the crystal structures and actual compositions, the TCBCO samples were examined by optical and electron microscopy, x-ray powder diffraction, and electron microanalysis. Electron microanalysis were obtained on a JSM model 35 scanning electron microscope, operated at 20 kV and 0.01-μA beam current with a 2.5-μm spot size. Standards included pure Tl and Cu metal, Ba-bearing glass, and a diopside$_{65}$-jadeite$_{35}$ pyroxene glass. A Philips model EM420 transmission electron microscope (TEM) with EDAX Si-Li detector and a Princeton Gamma-Tech model 4 data analysis system was utilized. TEM samples were mounted on holey-carbon, Be-mesh grids to avoid Cu contamination during qualitative analysis.

The TCBCO-1 sample consisted of two principal phases, both of which are black, opaque, and fine grained with particle sizes less than 10 μm maximum diameter. Electron microprobe analysis of more than 30 grains of the sample revealed two distinct, nearly stoichiometric compounds. In this regard, approximately 80% of the sample had a metal ratio of 2:2:2:3 yielding a formula $Tl_2Ca_2Ba_2Cu_3O_{10+x}$ while 20% had an approximate ratio 1:4:0:5 corresponding to a formula of $(Tl_{0.19}Ca_{0.81})CuO_{2+\delta}$.

Electron diffraction of this barium-poor compound revealed a large orthorhombic unit cell approximately 5.4×17.4 ×43.4 A$^3$, with a prominent pseudocubic subcell, approximately 5.4 A on edge. The material is highly twinned and displays streaking parallel to the long axis. Two additional samples with a 2223 and 1405 stoichiometry, as starting compositions, were synthesized. The 1405 compound is a semiconductor; the 2223 compound is a high-T$_c$ superconductor.

The TCBCO-2 sample was found to contain both the 2223 and 1405 phases. These phases comprised approximately 70% and 5%, respectively, of the sample. The composition of the 2223 from this sample was found to be more variable than in the TCBCO-1 sample. The sum of Ca+Ba was always close to 4, but the ratio of the elements varied from 50:50 to 45:55. Two additional phases, were observed during electron microanalysis that had nearly stoichiometric metal ratios of 2:1:2:2 and 3:4:0:0. These compounds each comprised approximately 15% of the sample.

The TCBCO-3 sample, which had a starting metal stoichiometry of 2:2:2:3, consisted primarily of 2122 phases plus unreacted oxides of copper and calcium. The 2122 phase had a pseudotetragonal unit-cell dimensions of 5.44×5.44×29.5 A$^3$, based on x-ray powder difraction of samples TCBCO-2 and TCBCO-3 (the 5.44 A spacing may be reduced by the usual factor of 2√). The positions and intensities of powder lines as set forth in Table I below. This phase displays a prominent and diagnostic (002) powder line corresponding to $a \sim 15A (2\theta \sim 6°$ with Cu radiation).

TABLE I. Powder x-ray diffraction lines for the high-T$_c$ phase $Tl_2Ca_1Ba_2Cu_2O_{6+}$ (2122). Patterns were obtained with filtered Cu radiation.

TABLE I

Powder x-ray diffraction lines for the high-T$_c$ phase $Tl_2Ca_1Ba_2Cu_2O_{6+x}$ (2122). Patterns were obtained with filtered Cu radiation.

| H | K | L | D$_{obs}$ | D$_{calc}$ | I/I$_o$ |
|---|---|---|---|---|---|
| 0 | 0 | 2 | 14.7 | 14.8 | 5 |
| 0 | 0 | 6 | 4.85 | 4.94 | 5 |
| 0 | 0 | 10 | 2.95 | 2.96 | 9 |
| 1 | 0 | 9 | 2.82 | 2.81 | 87 |
| 2 | 0 | 0 | 2.71 | 2.72 | 100 |
| 1 | 1 | 8 | 2.663 | 2.665 | 14 |
| 1 | 1 | 9 | 2.508 | 2.498 | 5 |
| 2 | 0 | 5 | 2.475 | 2.471 | 5 |
| 2 | 1 | 0 | 2.433 | 2.433 | 17 |
| 2 | 1 | 2 | 2.395 | 2.401 | 10 |
| 2 | 1 | 4 | 2.315 | 2.311 | 8 |
| 2 | 2 | 0 | 1.926 | 1.924 | 47 |
| 3 | 0 | 0 | 1.814 | 1.814 | 18 |
| 3 | 1 | 6 | 1.623 | 1.624 | 14 |
| 3 | 0 | 9 | 1.588 | 1.588 | 21 |
| 1 | 0 | 18 | 1.573 | 1.573 | 5 |
| 1 | 1 | 18 | 1.511 | 1.511 | 10 |
| 4 | 0 | 0 | 1.360 | 1.360 | 12 |
| 2 | 1 | 21 | 1.218 | 1.219 | 13 |

Electron and x-ray diffraction studies of the 2223 phase revealed a well-ordered tetragonal or pseudotetragonal unit cell with a—5.399±0.002A and c—36.25±0.02A (the 5.399A spacing may be reduced by the 2√factor). Table II, set forth below, lists positions and intensities of 26 powder lines.

TABLE II. Powder x-ray diffraction lines of the high-T$_c$ phase $Tl_2Ca_2Ba_2Cu_3O_{10+}$ (2223). Pure silicon (National Bureau of Standards Standard Reference Material 640) was used as an internal standard. Patterns were obtained with filtered Cu radiation.

TABLE II

Powder x-ray diffraction lines of the high-T$_c$ phase $Tl_2Ca_2Ba_2Cu_3O_{10+x}$ (2223). Pure silicon (National Bureau of Standards Standard Reference Material 640) was used as an internal standard. Patterns were obtained with filtered Cu radiation.

| h | k | l | d$_{obs}$ | d$_{calc}$ | I/I$_o$ |
|---|---|---|---|---|---|
| 0 | 0 | 2 | 17.8 | 18.1 | 25 |
| 0 | 0 | 4 | 8.93 | 9.06 | 1 |
| 0 | 0 | 6 | 5.95 | 6.04 | 1 |
| 0 | 0 | 8 | 4.46 | 4.52 | 10 |
| 1 | 1 | 5 | 3.39 | 3.38 | 39 |
| 1 | 0 | 9 | 3.228 | 3.228 | 15 |
| 1 | 1 | 7 | 3.079 | 3.073 | 87 |
| 0 | 0 | 12 | 3.028 | 3.021 | 1 |
| 1 | 1 | 9 | 2.766 | 2.771 | 100 |
| 2 | 0 | 0 | 2.696 | 2.699 | 63 |
| 2 | 0 | 2 | 2.663 | 2.669 | 15 |
| 2 | 0 | 5 | 2.522 | 2.529 | 41 |
| 1 | 0 | 13 | 2.481 | 2.478 | 19 |
| 2 | 1 | 1 | 2.408 | 2.409 | 6 |
| 2 | 0 | 8 | 2.321 | 2.319 | 15 |
| 2 | 0 | 10 | 2.166 | 2.165 | 7 |
| 1 | 0 | 16 | 2.090 | 2.089 | 16 |
| 1 | 1 | 17 | 1.862 | 1.862 | 26 |
| 0 | 0 | 21 | 1.726 | 1.726 | 22 |
| 3 | 1 | 7 | 1.622 | 1.621 | 15 |
| 2 | 0 | 19 | 1.557 | 1.558 | 15 |
| 2 | 2 | 14 | 1.537 | 1.536 | 22 |
| 2 | 2 | 16 | 1.459 | 1.460 | 11 |
| 3 | 2 | 7 | 1.439 | 1.438 | 11 |
| 0 | 0 | 26 | 1.394 | 1.394 | 11 |
| 4 | 1 | 7 | 1.269 | 1.269 | 15 |

The presence of a strong 18-A (002) powder line (2θ−5° with Cu radiation) is a diagnostic feature. The electron diffraction patterns of 2223 from the TCBCO-1 sample showed little streaking or other irregularities. High-resolution images of c* reveal a distinct layered structure, similar to that of the 2122 phase, but with few stacking faults. No superlattice reflections were observed, but faint ringlike diffraction around several diffraction maxima may indicate short-range ordering of defects.

It is concluded from compositional, powder x-ray, and TEM data that presumably the $Tl_2CaBa_2Cu_2O_{8+x}$ 2122 structures have a 15-A layer repeat of thallium oxide double layers and pairs of copper-oxygen planes separated by calcium. The 2223 structure of $Tl_2Ca_2Sr_2Cu_3O_{10+x}$ has a slightly longer 18-A repeat and an extra copper and calcium per formula unit.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for making a high temperature superconductor comprising the steps of:
    a) mixing $BaCO_3$ with $CuO$;
    b) grinding the resultant mixture to obtain a first mixture;
    c) heating the first mixture to obtain a uniform black $BaCu_3O_4$ powder;
    d) mixing the resultant $BaCu_3O_4$ powder with $Tl_2O_3$ and $CaO$;
    e) regrinding the mixture to create a second mixture; and
    f) heating the second mixture in flowing oxygen.

2. The method of claim 1 wherein the $BaCu_3O_4$ powder is mixed with $Tl_2O_3$ and $CaO$ to obtain a mixture having a nominal composition of $Tl_2Ca_{1.5}BaCu_3O_{7.8+x}$ wherein $7.8+x<13$.

3. The method of claim 1 wherein the $BaCu_3O_4$ powder is mixed with $Tl_2O_3$ and $CaO$ to obtain a mixture having a nominal composition of $Tl_{1.5}Ca_{0.5}BaCu_3O_{6.5+x}$ wherein $6.5+x<8.75$.

4. The method of claim 1 wherein $BaCu_3O_4$ powder was mixed with appropriate amounts of $Tl_2O_3$ and $CaO$ to obtain a mixture having a nominal composition of $Tl_{1.86}CaBaCu_3O_{7.8+x}$ wherein $7.8+x<9.44$.

5. The method of claim 1 wherein the second mixture is then removed from the heat and quenched in air to room temperature.

6. The method of claim 5 wherein the cooled mixture was then annealed at 450° C. in flowing oxygen.

7. The method of claim 1 wherein the second mixture is heated to a temperature of approximately 850° C. to about 950° C.

8. The method of claim 1 including the step of pressing the second mixture into a pellet.

9. The method of claim 1 including the step of heating the first mixture in air.

10. The method of claim 1 including the step of heating the first mixture to approximately 925° C. in air.

11. A method for making a high temperature superconductor comprising the steps of:
    a) providing amounts of $SrCO_3$ and $CuO$;
    b) mixing and grinding the composition;
    c) heating the mixture to obtain a uniform black $Sr_{0.45}Cu_3O_{3.5}$ powder;
    d) mixing the resultant $BaCu_3O_4$ powder with $Tl_2O_3$;
    e) regrinding the mixture to form a second mixture; and
    f) heating the second mixture.

12. The method of claim 11 wherein the $Sr_{0.45}Cu_3O_{3.5}$ powder is mixed with $Tl_2O_3$ to obtain a mixture with a nominal composition of $Tl_2Sr_{0.45}Cu_3O_{6.5+x}$.

13. The method of claim 12 wherein the reground mixture is pressed into a pellet.

14. The method of claim 12 wherein the second mixture is heated in flowing oxygen.

15. The method of claim 14 wherein the second mixture is heated to a temperature of approximately 1000° to about 1050° C.

16. A method for making a high temperature superconductor comprising the steps of:
    a) mixing $BaCO_3$ and $CuO$;
    b) grinding the resultant mixture;
    c) heating the mixture;
    d) mixing a resultant $BaCu_3O_4$ powder with $Tl_2O_3$ and $SrCO_3$;
    e) grinding the mixture of d);
    f) heating the mixture of e) in flowing oxygen to approximately 900° to about 950° in flowing oxygen; and
    g) cooling the heated mixture of f) to room temperature.

17. The method of claim 1 wherein $BaCu_3O_4$ powder is mixed with $Tl_2O_3$ and $CaO$ to obtain a mixture having a nominal composition of $Tl_2Ca_yBaCu_3O_{7+y}$ wherein: $Y=1, 1.5, 2, 3,$ and $4$.

18. The method of claim 1 wherein the heated second mixture is furnace-cooled to room temperature.

* * * * *